United States Patent
Wang et al.

(10) Patent No.: US 12,191,198 B2
(45) Date of Patent: Jan. 7, 2025

(54) LOW RESISTIVITY TUNGSTEN FILM AND METHOD OF MANUFACTURE

(71) Applicant: Applied Materials, Inc., Santa Clara, CA (US)

(72) Inventors: Feihu Wang, San Jose, CA (US); Joung Joo Lee, San Jose, CA (US); Xi Cen, San Jose, CA (US); Zhibo Yuan, Santa Clara, CA (US); Wei Lei, Campbell, CA (US); Kai Wu, Palo Alto, CA (US); Chunming Zhou, Fremont, CA (US); Zhebo Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/002,220

(22) Filed: Aug. 25, 2020

(65) Prior Publication Data

US 2022/0068709 A1   Mar. 3, 2022

(51) Int. Cl.
| H01L 21/768 | (2006.01) |
| H01L 21/285 | (2006.01) |
| H01L 23/532 | (2006.01) |
| H01L 21/02  | (2006.01) |
| H01L 23/528 | (2006.01) |

(52) U.S. Cl.
CPC .... H01L 21/76843 (2013.01); H01L 21/2855 (2013.01); H01L 21/28556 (2013.01); H01L 21/76876 (2013.01); H01L 21/76877 (2013.01); H01L 23/53266 (2013.01); H01L 21/02068 (2013.01); H01L 23/5283 (2013.01)

(58) Field of Classification Search
CPC ......... H01L 21/76843; H01L 21/76876; H01L 21/76877; H01L 21/02068; H01L 23/53266; H01L 23/5283; H01L 21/2855; H01L 21/28556
See application file for complete search history.

(56) References Cited

U.S. PATENT DOCUMENTS

| 6,716,733 B2  | 4/2004  | Lee et al. |
| 7,772,114 B2  | 8/2010  | Chan |
| 8,058,170 B2  | 11/2011 | Chandrashekar et al. |
| 8,216,933 B2  | 7/2012  | Wang et al. |
| 8,623,733 B2  | 1/2014  | Chen et al. |
| 8,895,450 B2  | 11/2014 | Cao et al. |
| 9,129,945 B2  | 9/2015  | Lee et al. |
| 10,043,670 B2 | 8/2018  | Ramalingam et al. |

(Continued)

FOREIGN PATENT DOCUMENTS

| EP | 1094504 A2 * | 4/2001 | ....... H01L 21/76843 |
| JP | H08162534 A  | 6/1996 | |

(Continued)

OTHER PUBLICATIONS

PCT International Search Report and Written Opinion in PCT/US2021/042305 dated Nov. 5, 2021, 11 pages.

*Primary Examiner* — Andres Munoz
(74) *Attorney, Agent, or Firm* — Servilla Whitney LLC

(57) ABSTRACT

Apparatus and methods to provide electronic devices comprising tungsten film stacks are provided. A tungsten liner formed by physical vapor deposition is filled with a tungsten film formed by chemical vapor deposition directly over the tungsten liner.

16 Claims, 2 Drawing Sheets

(56) References Cited

U.S. PATENT DOCUMENTS

| | | |
|---|---|---|
| 2006/0276020 A1 | 12/2006 | Yoon et al. |
| 2009/0053882 A1* | 2/2009 | Wang .................. C23C 14/0641 |
| | | 257/E21.294 |
| 2010/0267235 A1 | 10/2010 | Chen et al. |
| 2012/0077342 A1 | 3/2012 | Gao et al. |
| 2012/0153483 A1* | 6/2012 | Akolkar ............ H01L 23/53261 |
| | | 257/E23.141 |
| 2013/0302980 A1* | 11/2013 | Chandrashekar ........................... |
| | | H01L 21/32133 |
| | | 438/666 |
| 2014/0073135 A1 | 3/2014 | Guan et al. |

FOREIGN PATENT DOCUMENTS

| | | |
|---|---|---|
| KR | 20010051101 A | 6/2001 |
| WO | 2013148880 A1 | 10/2013 |

\* cited by examiner

LOW RESISTIVITY TUNGSTEN FILM AND METHOD OF MANUFACTURE

TECHNICAL FIELD

Embodiments of the present disclosure pertain to the field of electronic device manufacturing, and in particular, to integrated circuit (IC) manufacturing. In particular, embodiments of the disclosure are directed to low resistivity tungsten films and methods of manufacturing low resistivity tungsten films.

BACKGROUND

Integrated circuits are made possible by processes that produce intricately patterned material layers on substrate surfaces. Producing patterned material on a substrate requires controlled methods for deposition of desired materials. Selectively depositing a film on one surface relative to a different surface is useful for patterning and other applications.

In conventional fill scheme utilizing a tungsten deposition process, a titanium nitride (TiN) layer is deposited on a dielectric substrate as barrier layer and liner layer, followed by deposition of a nucleation or seed layer of a bulk CVD tungsten (W) film. The resistivity of the TiN layer is high, and it is challenging to reduce the resistivity of bulk CVD tungsten grown on the nucleation layer. With increases in aspect ratio (the ratio of trench or via height to trench or via width) and/or smaller feature sizes such as the width of a feature, conventional processes produce tungsten film stacks with unacceptably high line resistance or via contact resistance.

Therefore, a need exists for improved methods for forming tungsten layers, films, and materials and for devices containing such tungsten layers, films, and materials.

SUMMARY

Apparatus and methods for depositing metal films are described. In one embodiment, a method of forming a tungsten stack on a substrate comprises forming a tungsten liner layer on a surface of the substrate using a physical vapor deposition process; and forming a tungsten film directly on the tungsten liner layer using a chemical vapor deposition process.

One or more embodiments are directed to a method of forming a tungsten stack on a substrate, the method comprising placing the substrate on a substrate support in a physical vapor deposition chamber; forming a tungsten liner layer on a surface of the substrate using a physical vapor deposition process; controlling the grain size of the tungsten liner layer to greater than 100 Ångstroms; and forming a tungsten film directly on the tungsten liner layer using a chemical vapor deposition process.

In another aspect, an electronic device comprises a physical vapor deposition-deposited tungsten liner layer on a surface; and a chemical vapor-deposition-deposited film directly on the tungsten liner layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
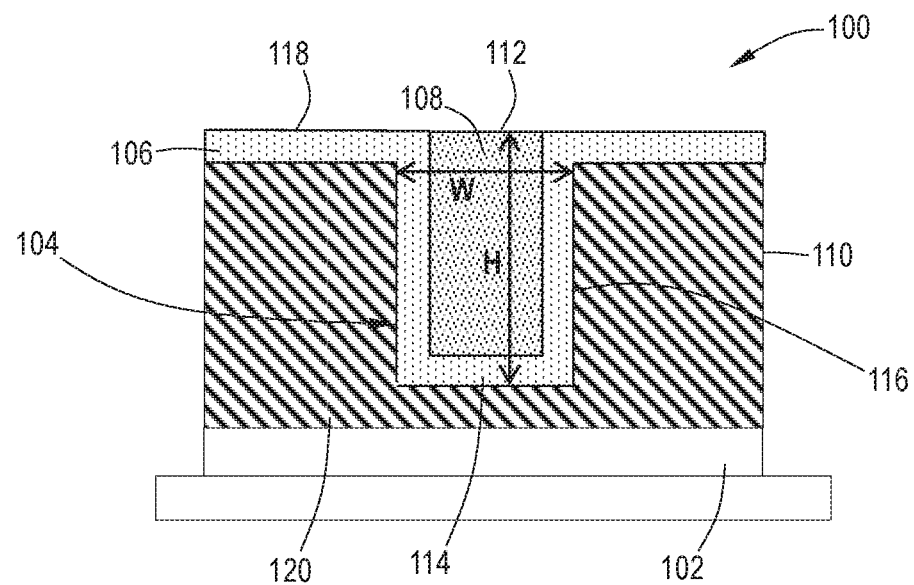
FIG. 1 shows a cross-sectional schematic view of a semiconductor device in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "liner" refers to a layer conformably formed along at least a portion of the sidewalls and/or lower surface of an opening such that a substantial portion of the opening prior to the deposition of the layer remains unfilled after deposition of the layer. In some embodiments, the liner may be formed along the entirety of the sidewalls and lower surface of the opening. A liner may also be formed on a flat surface of a flat substrate.

Advantageously, a physical vapor deposition-deposited tungsten liner layer having a chemical vapor deposition-deposited tungsten film directly on the physical vapor deposition-deposited tungsten liner layer shows a clear stack resistance benefit compared to a convention device which includes a TiN layer plus a nucleation layer followed by tungsten deposited by chemical vapor deposition (CVD). In some embodiments, there may be an air break, or exposure of the substrate to ambient conditions between deposition of the tungsten liner layer by physical vapor deposition (PVD) and deposition of the tungsten film by CVD. However, in specific embodiments, there is no air break between forming the tungsten liner layer by a PVD process and formation of the tungsten film by a CVD process. In other words, the two processes are completed under a vacuum or under load lock conditions. In some embodiments, processing that includes deposition of the tungsten liner layer using PVD with no bias power applied to the substrate support upon which the substrate is supported results in improved properties in terms of grain size and orientation to improve the stack resistivity of the tungsten stack comprising the tungsten liner layer and the tungsten film. In some embodiments, the PVD process is conducted using a Kr process gas to further tailor the properties of the device. In one or more embodiments, the tungsten liner layers comprise alpha-W, and there is no beta-W in the tungsten liner layer.

Figure 2:
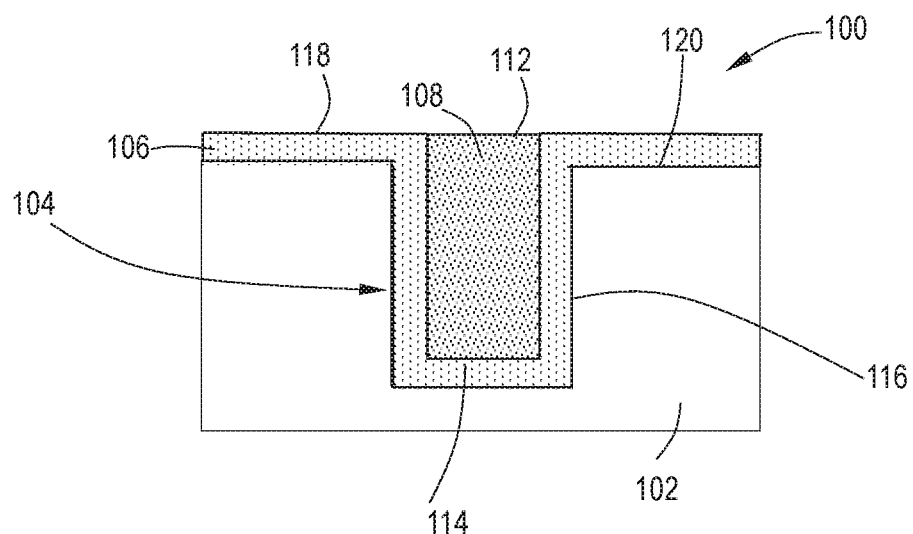
FIG. 2 shows a cross-sectional schematic view of a semiconductor device in accordance with one or more embodiments of the disclosure.
Figure 3:
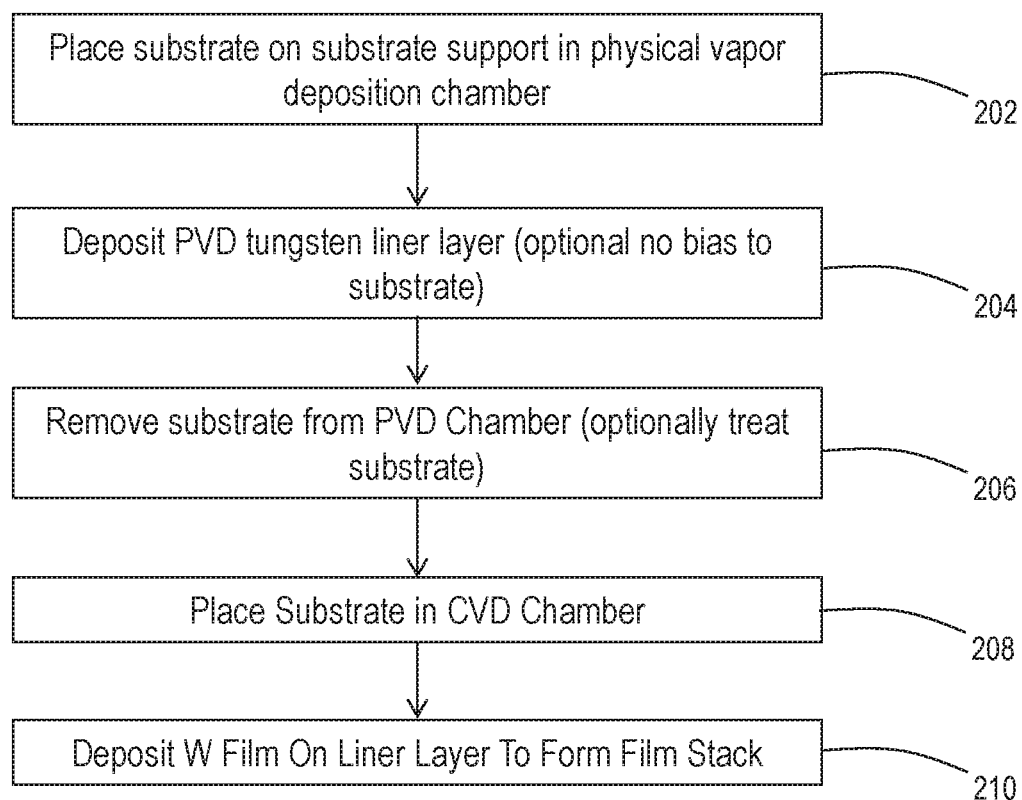
FIG. 3 shows a flowchart of a method according to an embodiment.

With reference to FIGS. 1-3, apparatus and methods for depositing metal films are described. In one embodiment, a method 200 comprises forming a tungsten stack on a substrate 102. The method comprises forming a tungsten liner layer 106 on a surface of the substrate 102 using a physical vapor deposition process and then forming a tungsten film 108 directly on the tungsten liner layer using a chemical vapor deposition process. In one or more embodiments, the tungsten liner layer 106 is substantially free of tungsten oxide. In some embodiments, the tungsten stack comprising the tungsten liner layer 106 and the tungsten film 108 formed by the method does not include a TiN layer or a nucleation layer. In one or more embodiments, the method 200 includes forming a dielectric layer 110 on the substrate surface prior to forming the tungsten liner layer 106.

In some embodiments, the substrate surface comprises a feature. In some embodiments, the feature is selected from a trench, a via, or a peak. In specific embodiments, the feature comprises a trench. In some embodiments, the method 200 further comprises at 202 forming the tungsten liner layer in a PVD chamber, and at 206 removing the substrate from the PVD chamber, exposing the substrate to ambient atmosphere and treating the tungsten liner layer to remove tungsten oxide from the tungsten liner layer. As used herein, "ambient atmosphere" refers to an atmosphere that is not under a vacuum and exposure to air. In some embodiments, treating the tungsten liner layer comprises exposing the tungsten liner layer to hydrogen gas and exposing the tungsten liner layer to $WF_6$ gas.

In other embodiments, the method 200 further comprises at 204 forming the tungsten liner layer in a PVD chamber, removing the substrate from the PVD chamber at 206, and at 208 placing the substrate in a CVD chamber without exposing the substrate to ambient atmosphere. At 210, the tungsten film 108 is deposited directly on the tungsten liner layer 106 to form the W film stack. In some embodiments, the trench has a width W of greater than or equal to 5 nm and less than or equal to 65 nm, greater than or equal to 5 nm and less than or equal to 55 nm, greater than or equal to 5 nm and less than or equal to 45 nm, greater than or equal to 5 nm and less than or equal to 35 nm, greater than or equal to 5 nm and less than or equal to 32 nm, greater than or equal to 5 nm and less than or equal to 25 nm, or greater than or equal to 5 nm and less than or equal to 22 nm.

In some embodiments, the method 200 further comprises at 202 placing the substrate on a substrate support in a physical vapor deposition chamber and not applying a bias voltage to the substrate support.

Another aspect of the disclosure pertains to a method of forming a tungsten stack on a substrate, the method comprising placing the substrate on a substrate support in physical vapor deposition process chamber, forming a tungsten liner layer on a surface of the substrate using a physical vapor deposition process, controlling the grain size of the tungsten liner layer to greater than 100 Ångstroms and forming a tungsten film directly on the tungsten liner layer using a chemical vapor deposition process. In some embodiments, controlling the grain size of the tungsten liner layer includes not applying a bias voltage to the substrate support during the physical vapor deposition process. In some embodiments, the CVD-deposited tungsten film has a grain size exceeding 250 Ångstroms. In some embodiments, the PVD-deposited tungsten liner layer has a grain size exceeding 100 Ångstroms, and the tungsten film has a grain size exceeding 250 Ångstroms. In one or more embodiments, the tungsten stack has a resistivity of less than 13 μohm-cm, less than 12.5 μohm-cm, less than 12 μohm-cm, less than 11.5 μohm-cm or less than less than 11 μohm-cm. In some embodiments, use of Kr as a process gas during the PVD process has a beneficial effect in increasing grain size of the tungsten liner. Experimental data showed that using Ar as a process gas for a PVD process at room temperature (about 25° C.), the W liner layer grain size was 137 Ångstroms, while using Ar as a process gas for a PVD process at 325° C. increased the W liner layer grain size to 180 Ångstroms. However, using Kr as a process gas for a PVD process at room temperature (about 25° C.) increased the W liner layer grain size to 210 Ångstroms. For tungsten stacks including a CVD-deposited film on each of these liner layers, using Ar as a process gas for a PVD process at room temperature (about 25° C.), the W liner layer grain size was 137 Ångstroms, and the stack resistivity was about 11 μohm-cm. Using Ar as a process gas for a PVD process at 325° C. increased the W liner layer grain size to 180 Angstroms, and resulted in a stack resistivity of a stack including a CVD-deposited film on the tungsten liner layer of about 9.8 μohm-cm. Using Kr as a process gas for a PVD process at room temperature (about 25° C.) increased the W liner layer grain size to 210 Angstroms, and resulted in a stack resistivity of a stack including a CVD-deposited film on the tungsten liner layer of about 9.6 μohm-cm.

Another aspect of the disclosure pertains to an electronic device comprising a physical vapor deposition-deposited tungsten liner layer on a surface and a chemical vapor-deposition-deposited tungsten film directly on the tungsten liner layer. In some embodiments the physical vapor deposition-deposited tungsten liner has a grain size greater than 100 Ångstroms. In some embodiments, the chemical vapor-deposition-deposited tungsten film has a grain size exceeding 250 Ångstroms. In one or more embodiments, the substrate surface comprises a feature selected from the group consisting of a trench, a via, and a peak. In one or more embodiments, the feature is a trench having a width less than 65 nm.

In some embodiments, the W liner layer has grain size greater than 100 Ångstroms, greater than 150 Ångstroms, or greater than 200 Ångstroms, and the tungsten film stack comprising the tungsten liner layer and the tungsten film has a stack resistivity less than 10 µohm-cm. In some embodiments, the device comprises a trench having a width W of greater than or equal to 5 nm and less than or equal to 65 nm, greater than or equal to 5 nm and less than or equal to 55 nm, greater than or equal to 5 nm and less than or equal to 45 nm, greater than or equal to 5 nm and less than or equal to 35 nm, greater than or equal to 5 nm and less than or equal to 32 nm, greater than or equal to 5 nm and less than or equal to 25 nm, or greater than or equal to 5 nm and less than or equal to 22 nm. In some embodiments, the trench has an aspect ratio of depth or height H to width W of greater than or equal to about 5:1, 10:1, 15:1, 20:1, 25:1, 30:1, 35:1 or 40:1. In one or more embodiments the aspect ratio is greater than 10:1.

In some embodiments, the tungsten film formed on the PVD-deposited liner layer is formed by exposing the substrate to plasma formed from a first gas. In some embodiments, the first gas comprises a tungsten precursor gas. In some embodiments, the first gas comprises a fluorine free tungsten halide precursor, such as tungsten pentachloride ($WCl_5$) or tungsten hexachloride ($WCl_6$). In other embodiments, the first gas comprises a fluorine free tungsten oxy-halide precursor, such as $WOCl_4$ or $WO_2Cl_2$. In other embodiments, the first gas is selected from the group consisting of a fluorine free halide precursors, a chlorine free tungsten halide precursor, such as tungsten pentabromide ($WBr_5$) or tungsten hexabromide ($WBr_6$). In some embodiments, the first gas further comprises a reactant gas, such as a hydrogen containing gas, such as hydrogen ($H_2$) or ammonia ($NH_3$) or hydrazine $N_2H_4$), and a carrier gas, such as argon (Ar), helium (He), or nitrogen ($N_2$), along with the tungsten precursor gas. In some embodiments, the carrier gas is an inert gas. In some embodiments, the first gas consists of, or consists essentially of, a tungsten precursor gas, a reactant gas, and a carrier gas. In some embodiments, the first gas consists of, or consists essentially of a chlorine-free, fluorine-free tungsten halide precursor, a hydrogen containing gas, and an inert gas. The carrier gas may be provided at a flow rate of about 10 sccm to about 10 slm.

The inventive methods may be utilized with any device nodes, but may be particularly advantageous in device nodes of about 25 nm or less, for example about 5 nm to about 25 nm.

The Figures show substrates having a single feature for illustrative purposes, however, those skilled in the art will understand that there can be more than one feature. The shape of the feature can be any suitable shape including, but not limited to, peaks, trenches and cylindrical vias. In specific embodiments, the feature is a trench. In other specific embodiments, the feature is a via. As used in this regard, the term "feature" means any intentionally-formed surface irregularity. Suitable examples of features include, but are not limited to trenches which have a top, two sidewalls and a bottom, peaks which have a top and two sidewalls extending upward from a surface, and vias which have sidewalls extending down from a surface with an open bottom. Features can have any suitable aspect ratio (ratio of the depth of or height H of the feature to the width of the feature). In some embodiments, the aspect ratio is greater than or equal to about 5:1, 10:1, 15:1, 20:1, 25:1, 30:1, 35:1 or 40:1. In one or more embodiments the aspect ratio is greater than 10:1.

In one or more embodiments, the at least one feature extends a depth or height H from a top surface of the substrate or a top surface of the tungsten liner layer to a bottom surface. The at least one feature has a width W defined by a first sidewall and a second sidewall. A tungsten film is deposited on the tungsten layer to fill the at least one feature and extend above the top surface of tungsten layer. The tungsten film may be recessed to lower a top of the metal film to a height equal to or below the top surface of the tungsten liner layer to form a recessed metal film. The tungsten film may be expanded to form pillars extending from the at least one feature.

With reference to FIGS. 1 and 2, one or more embodiments are directed to methods of forming a semiconductor device 100. A substrate 102 is provided with a feature 104 filled with a tungsten film 108. The feature 104 shown is in the form of a trench having a width W and a depth or height H.

In one or more embodiments the tungsten film 108 is CVD-deposited tungsten film. In one embodiment, the tungsten film is a gapfill layer. As shown in FIG. 1, in one embodiment, tungsten film 108 is deposited on a tungsten liner layer 106 on the top portion 114 of the feature 104, the sidewalls 116 of the feature 104 and top portions 118 of a dielectric layer 110.

In one or more embodiments the tungsten film 108 is a seed gapfill layer. In one embodiment, the seed gapfill layer is a selective growth seed film. As shown in FIG. 1, in one embodiment, tungsten film 108 is deposited on a tungsten liner layer 106 on the top portion 114 of the feature 104, the sidewalls 116 of the feature 104 and top portions 118 of a dielectric layer 110.

As shown in FIG. 2, in another embodiment, a tungsten film 108 is deposited on a tungsten liner layer 106 on the top portion 114 of the feature 104, the sidewalls 116 of the feature 104 and top surface 120 of the substrate 102.

In one or more embodiments, the tungsten film 108 is a tungsten layer. In one or more embodiment, the tungsten layer is a tungsten gapfill layer.

In one or more embodiment, a dielectric layer 110 is formed on the substrate 102. The dielectric layer can be any suitable dielectric material including, but not limited to, nitride, oxides, or carbides of titanium or silicon. The dielectric layer 110 can be formed conformally on the substrate 102 or non-conformally.

In one embodiment, the dielectric layer 110 includes a dielectric material having a k-value less than 5. In one embodiment, dielectric layer 110 includes a dielectric material having a k-value less than 2. In at least some embodiments, dielectric layer 110 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof. In at least some embodiments, dielectric layer 110 may include polyimide, epoxy, photodefinable materials, such as benzocyclobutene (BCB), and WPR-series materials, or spin-on-glass.

In one embodiment, the thickness of the dielectric layer 110 is in an approximate range from about 10 nanometers (nm) to about 2 microns (µm). In an embodiment, dielectric layer 110 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In embodiment, the tungsten liner layer 106 is deposited on the dielectric layer 110. In one embodiment, tungsten liner layer 106 is a conductive liner. In some embodiments, tungsten liner layer 106 is formed by a PVD process.

In an embodiment, tungsten liner layer 106 is deposited to the thickness from about 5 Å to about 35 Å. In an embodiment, the tungsten liner layer 106 is deposited to a thickness in a range from about 10 Å to about 30 Å.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a tungsten stack and filling a trench on a substrate, the method comprising:

placing the substrate on a substrate support in a physical vapor deposition chamber, not applying a bias voltage to the substrate support, and forming a tungsten liner layer on the trench comprising dielectric material, two sidewalls and a bottom, the tungsten liner layer covering the two sidewalls and the bottom and formed using a physical vapor deposition process using Kr as a process gas; and forming a tungsten film directly on the tungsten liner layer to form the tungsten stack having a stack resistivity, the tungsten film formed using a chemical vapor deposition process and filling the trench, wherein formation of the tungsten film does not include forming a nucleation layer on the tungsten liner layer, wherein the trench has a width less than 65 nm, wherein not applying the bias voltage to the substrate support controls the grain size of the tungsten liner layer to greater than 200 Ångstroms and improves the stack resistivity.

2. The method of claim 1, wherein the tungsten liner layer is free of tungsten oxide.

3. The method of claim 2, wherein the tungsten stack formed by the method does not include a TiN layer.

4. The method of claim 2, wherein the method further comprises forming the tungsten liner layer in a PVD chamber, removing the substrate from the PVD chamber, exposing the substrate to ambient atmosphere and treating the tungsten liner layer to remove tungsten oxide from the tungsten liner layer.

5. The method of claim 4, wherein treating the tungsten liner layer comprises exposing the tungsten liner layer to hydrogen gas and exposing the tungsten liner layer to $WF_6$ gas.

6. The method of claim 2, wherein the method further comprises forming the tungsten liner layer in a PVD chamber, removing the substrate from the PVD chamber, and placing the substrate in a CVD chamber without exposing the substrate to ambient atmosphere.

7. The method of claim 2, wherein forming the tungsten liner layer on the substrate using Kr as the process gas increases the grain size of the tungsten liner layer compared to a process that uses an Ar process gas.

8. The method of claim 7, wherein the tungsten liner layer comprises alpha-W and no beta-W.

9. The method of claim 7, wherein the tungsten film has a grain size exceeding 250 Ångstroms.

10. The method of claim 9, wherein the tungsten film stack has a resistivity of less than 10 μohm-cm.

11. The method of claim 2, wherein forming the tungsten liner layer on the substrate using Kr as the process gas is performed at about 25° C.

12. The method of claim 11, wherein the tungsten liner layer comprises alpha-W and no beta-W.

13. The method of claim 1, wherein the trench comprises an aspect ratio of height to width of greater than or equal to about 5:1.

14. The method of claim 13, wherein the trench has a width less than 25 nm.

15. The method of claim 1, wherein the tungsten film stack has a resistivity of less than 10 μohm-cm.

16. The method of claim 1, wherein the trench comprises an aspect ratio of height to width of greater than or equal to about 10:1.

* * * * *